United States Patent [19]
Shi

[11] Patent Number: 6,100,012
[45] Date of Patent: Aug. 8, 2000

[54] INFRA-RED RADIATION POST-EXPOSURE BAKE PROCESS FOR CHEMICALLY AMPLIFIED RESIST LITHOGRAPHY

[75] Inventor: Xuelong Shi, San Jose, Calif.

[73] Assignee: National Semiconductor Corporation, Santa Clara, Calif.

[21] Appl. No.: 09/110,642

[22] Filed: Jul. 6, 1998

[51] Int. Cl.[7] .................................................... G03C 5/00
[52] U.S. Cl. ......................... 430/311; 430/328; 430/330
[58] Field of Search ................................... 430/330, 328, 430/311

[56] References Cited

U.S. PATENT DOCUMENTS

| | | | |
|---|---|---|---|
| 4,532,427 | 7/1985 | Matthews et al. | 430/311 |
| 5,352,326 | 10/1994 | Cywar et al. | 430/328 |
| 5,932,391 | 8/1999 | Ushirogouchi et al. | 430/270.1 |

OTHER PUBLICATIONS

McMurry, John: Chapter 12, Organic Chemistry, pp. 424–436, 1992.

Ito, H. Chemical Amplification Resists: History and Development Within IBM, IBM J. Res. Develop. vol. 41, No. 1/2 (1997).

Lamola, A. et al.: Chemically Amplified Resists, Sold State Technology, pp. 53–60 (1991).

MacDonald, S. et al.: Chemical Amplification in High–Resolution Imaging Systems, Acc. Chem. Res. vol. 27, No. 6, (1994).

*Primary Examiner*—S. Rosasco
*Attorney, Agent, or Firm*—Limbach & Limbach LLP

[57] ABSTRACT

A photolithographic process for use in semiconductor device manufacturing that includes an infrared radiation-based post exposure bake (PEB) of a chemically amplified resist layer and that improves critical dimension control of a patterned resist layer. The use of infrared radiation with a wavenumber that is preferentially absorbed in the DUV-exposed regions of the chemically amplified resist selectively increases the temperature of the DUV-exposed regions, while maintaining the temperature in the DUV-unexposed regions relatively low. The increased temperature initiates and accelerates acid catalyzed chemical transformation of the resist polymer in the DUV-exposed regions. The lower temperature in the DUV-unexposed regions suppresses the diffusion/migration of acid catalyst into those regions from the DUV-exposed regions.

11 Claims, 2 Drawing Sheets

INFRA-RED RADIATION POST-EXPOSURE BAKE PROCESS FOR CHEMICALLY AMPLIFIED RESIST LITHOGRAPHY

BACKGROUND OF THE INVENTION

1. Field of the Invention

The present invention relates to photolithographic processes used in semiconductor integrated circuit device manufacturing and, in particular, to an infrared radiation post-exposure bake process of a chemically amplified resist layer for improving critical dimension control in a resultant patterned resist layer.

2. Description of the Related Art

Photolithographic processes are used in semiconductor integrated circuit device fabrication to define the dimensions and pattern of the circuit elements. FIGS. 1A–1C depict a series of typical photolithographic processes. In the processes, a resist layer 10 is first coated on a substrate (or other underlying layer) 12. Selected regions 14 of the resist layer 10 are then exposed to radiation (e.g. light emitted from a mercury arc lamp or excimer laser) through a mask 16, thereby changing the chemical structure and dissolution rate of these regions. Selective dissolution (i.e. development) of the resist layer produces a patterned resist layer 18.

Since the dimensional resolution that can be obtained in the patterned resist layer 18 (i.e. the smallest sized pattern that can be achieved) is proportional to the wavelength of the radiation used to expose the resist layer, deep ultraviolet (DUV) light (248 nm in wavelength) is often employed during fabrication of patterned resist layers with critical dimensions of 0.35 μm and below. Commercially available DUV light sources can, however, deliver only a relatively low flux of DUV radiation to the resist layer. This limitation necessitates the use of a resist that is highly sensitive to DUV radiation.

"Chemically amplified" resists constitute one category of highly sensitive resists. Exposure of chemically amplified resists to DUV radiation generates a catalyst (typically an acid) therein. The catalyst then initiates a series of chemical transformations (reactions) in the resist layer which changes the structure and dissolution rate of the resist layer during development. Prior to development, this catalyst-initiated chemical transformation requires a thermal activation step, commonly referred to as a "post-exposure bake" (PEB). See H. Ito, *Chemical Amplification Resists: History and Development within IBM,* IBM J. Res. Develop., Vol. 41, No. 1/2, January/March, pp. 69–80 (1997); A. A. Lamola et al., *Chemically Amplified Resists,* Solid State Technology, August, pp. 53–60 (1991); and S. A. MacDonald et al., *Chemical Amplification in High-Resolution Imaging Systems,* Accounts of Chemical Research, Vol. 27, No. 6, pp. 151–158 (1994) for a detailed discussion of chemically amplified resist photolithographic processing, each of which is hereby incorporated by reference.

FIG. 2 illustrates the chemical reactions that occur in a conventional chemically amplified resist layer during processing. The process depicted in FIG. 2 employs a chemically amplified resist that includes: (i) poly(4-hydroxystyrene) (PHOST) that has been partially protected by t-butoxycarbonyl (t-BOC) to form poly(t-butoxycarbonyloxystyrene) resist polymers and (ii) a photochemical acid generator (PAG). The ratio of the phenyl-OH functional group to the t-BOC functional group (i.e. the ratio of m to n in FIG. 2) in the protected PHOST molecule is about 7:3. This resist composition is representative of several commercially available chemically amplified resists.

As illustrated in FIG. 2, when the PAG (for example, an onium salt PAG, such as triphylsulfonium hexafluorantimonate) is exposed to DUV radiation (hν), an acid catalyst (depicted as $H^+$) is generated in the DUV-exposed region. Upon heating (Δ) of the chemically amplified resist layer during PEB, the acid catalyst initiates removal and subsequent decomposition of the acid labile t-BOC functional group and the release of $CO_2$ and isobutylene. The acid catalyzed removal of the protecting t-BOC functional group produces a resist polymer product in the DUV-exposed region with enhanced polarity and, therefore, an increased aqueous base dissolution rate.

A PEB process serves two primary functions. First it provides energy for the resist polymer to overcome the chemical transformation activation energy barrier. Second, it increases the diffusion rate of the acid catalyst so that the catalyst can migrate short distances and catalyze a series of resist polymer decomposition sites.

Conventional PEB process steps are conducted in an oven at around 130° C.–140° C., for a period of about 90 seconds. These processes employ electrical resistance heaters, known as hot plates, that deliver heat evenly to the DUV-exposed and DUV-unexposed regions of the resist layer. As a consequence, the temperature and, therefore, the catalyst diffusion rate remain essentially uniform between the DUV-exposed and DUV-unexposed regions. This uniformity in catalyst diffusion rate enables the catalyst to freely migrate into, and to initiate undesired catalyzed chemical transformations in, the DUV-unexposed regions. During development, these catalyzed chemical transformations cause unintended changes in critical dimensions of the patterned resist layer. Such catalyst diffusion-induced critical dimension changes are difficult to characterize and predict since they are dependent on the geometry of the DUV-exposed region, as well as neighboring DUV-exposed and DUV-unexposed regions. This complexity limits the ability to compensate for catalyst diffusion-induced critical dimension changes by incorporating "corrections" into the mask.

Still needed in the art is a photolithographic process employing chemically amplified resists that minimizes catalyst diffusion-induced critical dimension changes and provides for improved control of patterned resist critical dimensions.

SUMMARY OF THE INVENTION

A process for forming patterned resist layers during semiconductor device fabrication according to the present invention improves critical dimension control by using an infrared (IR) radiation-based PEB step to selectively increase the temperature of regions of a chemically amplified resist layer that have been exposed to a first radiation (e.g., DUV radiation or another first radiation such as light emitted from a mercury arc lamp or excimer laser), while maintaining the temperature (and, therefore, the catalyst diffusion rate) of unexposed regions relatively low. This is accomplished by utilizing IR radiation of a wavenumber that is selectively absorbed by functional chemical groups present in the resist polymer product of the acid catalyzed chemical transformation that occurs during PEB in the exposed regions. The absorbed IR radiation is transformed into heat that increases the temperature of the exposed regions and consequently accelerates the acid catalyzed chemical transformation in the DUV-exposed region. Since the accelerated acid catalyzed chemical transformation yields the resist polymer product containing the functional chemical groups that selectively absorbs the IR radiation, a beneficial process cycle is created. On the other hand, the unexposed regions are initially devoid of catalyst and, therefore, essentially no IR absorbing resist polymer products are formed there. Consequently, IR absorption, heat generation and temperature increase are considerably less in the unexposed regions. Catalyst diffusion-induced critical dimension control is improved in the present invention since the migration of catalyst into the unexposed regions is impeded or significantly slower than in the exposed regions due to the temperature in unexposed regions being maintained relatively low.

The photolithographic process includes the step of coating a chemically amplified resist layer onto a substrate. Next, regions of the chemically amplified resist layer are selectively exposed to a first radiation to form exposed and unexposed regions of the chemically amplified resist layer. After the exposure, both the exposed and unexposed regions of the chemically amplified resist layer are irradiated with infrared radiation for a predetermined time. This IR irradiation step employs infrared radiation of a wavenumber that is preferentially absorbed by the exposed region, in comparison to the unexposed regions of the chemically amplified resist layer. Due to the preferential absorption, these exposed regions are heated to a higher temperature than the unexposed regions. Finally, the chemically amplified resist layer is developed to form a patterned chemically amplified resist layer.

In one embodiment of the process according to the present invention, the substrate is first coated with a chemically amplified resist layer that includes poly(4-hydroxystyrene) (PHOST) which has been partially protected by t-butoxycarbonyl (t-BOC). Next, regions of the chemically amplified resist layer are exposed to DUV radiation, with a wavelength of 248 nm, to produce DUV-exposed regions of the chemically amplified resist layer and DUV-unexposed regions of the chemically amplified resist layer. Both the DUV-exposed and DUV-unexposed regions of the chemically amplified resist layer are subsequently irradiated with IR radiation with a wavenumber of 3400 cm$^{-1}$ for a prescribed period of time, in order to selectively heat the DUV-exposed regions. Finally the chemically amplified resist layer is developed to define a patterned chemically amplified resist layer.

BRIEF DESCRIPTION OF THE DRAWINGS

A better understanding of the features and advantages of the present invention will be obtained by reference to the following detailed description that sets forth illustrative embodiments in which the principles of the invention are utilized, and the accompanying drawings, of which.

DETAILED DESCRIPTION OF THE INVENTION

FIGS. 3A–3D illustrate various steps of a lithographic process according to the present invention.

Figure 1A:
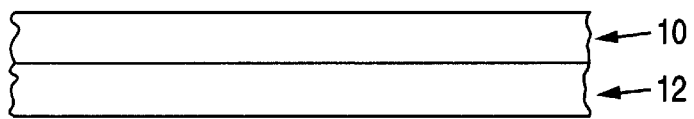
FIGS. 1A–1C are cross-sectional views illustrating steps in a conventional lithographic process for forming a patterned resist layer.
Figure 1B:
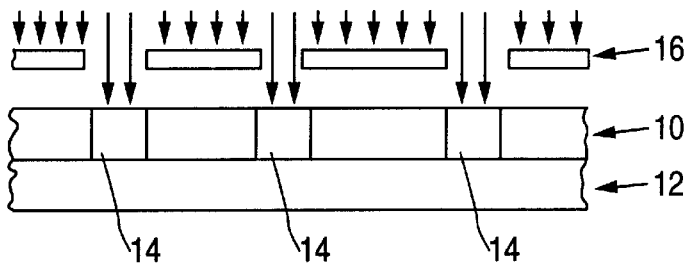
Figure 1C:
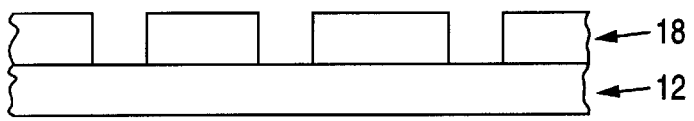
Figure 3A:
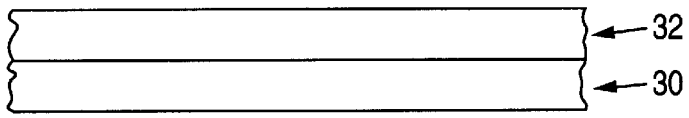
FIGS. 3A–3D are cross-sectional views illustrating process steps in accordance with the present invention.

A substrate 30 is first coated with a chemically amplified resist layer 32, as shown in FIG. 3A. Substrate 30 can be, for example, a single material (such as a bare silicon wafer) or a silicon wafer at any stage of a semiconductor device fabrication, regardless of whether multiple patterned or unpatterned layers are present on the wafer surface. The particular make-up of substrate 30 will, therefore, depend on the stage of a semiconductor device fabrication process which employs a photolithographic step.

The range of thickness for the chemically amplified resist layer 32 is identical to that used in conventional chemically amplified resist processes, generally 6500 to 8500 angstroms. The chemically amplified resist layer 32 can be coated on the substrate 30 by processes that are well known to those skilled in the art. For example, a resist can be dispensed on the center of the substrate while the substrate is spun at a predetermined speed, in order to spread the resist over the substrate surface and achieve a desired thickness. Commercially available resists typically include a solvent. Subsequent to the coating, any solvent remaining in chemically amplified resist layer 32 is evaporated using conventional soft bake hot plate-based processes (not shown).

Various DUV chemically amplified resists can be employed in the coating step of the present invention. As will be explained in more detail below, the only criteria is that the chemistry of the DUV chemically amplified resist provides a basis for utilizing IR radiation of a wavenumber that is preferentially absorbed in DUV-exposed regions of the resist layer, relative to DUV-unexposed regions. For example, although the chemistry of Shipley DUV 3, 5, and 6 chemically amplified resists (available through Shipley Co., Newton, Mass.) is kept confidential by the manufacturer, it is believed to be based on PHOST partially protected by t-BOC. During PEB, the acid catalyzed chemical transformations in these resists produce additional phenyl-OH functional groups on the resist polymer (see FIG. 2). This chemistry provides a basis for selecting IR radiation of a wavenumber, 3400 cm$^{-1}$, that is strongly absorbed by the phenyl-OH functional groups.

The remainder of discussion focuses on poly(4-hydroxystyrene) (PHOST) chemically amplified resist that has been partially protected by t-butoxycarbonyl (t-BOC). Other chemically amplified resist compositions known to those skilled in the art, including copolymers of 4 hydroxystyrene and 4-[(tert-butyloxy-carbonyl)oxy]styrene and p-vinylphenol and vinylbenzylacetate are also suitable, so long as a functional chemical group with a unique IR absorption behavior is created in the acid catalyzed chemical transformation product.

Figure 3B:
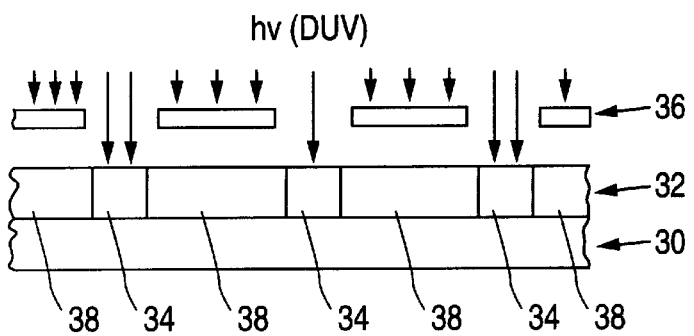

The chemically amplified resist layer is then exposed to DUV radiation (typically at wavelengths of either 193 nm or 248 nm and an exposure energy in the range of 15–35 millijoule/cm$^2$) through mask 36 to produce DUV-exposed regions 34 and DUV-unexposed regions 38, as illustrated in FIG. 3B. Exposure to DUV radiation generates an acid catalyst in the DUV-exposed regions of the chemically amplified resist layer.

Figure 3C:
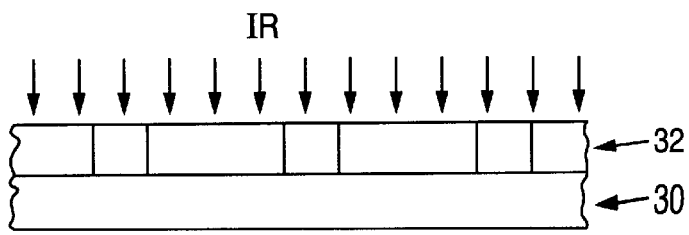

Next both the DUV-exposed and DUV-unexposed regions of the chemically amplified resist layer are irradiated with IR radiation, as shown in FIG. 3C. The selection of the wavenumber of the irradiating IR to be utilized depends on the particular resist chemistry. For the t-BOC protected PHOST chemically amplified resist, IR radiation with a wavenumber of 3400 cm$^{-1}$ is employed. This particular wavenumber is selected, since it matches a vibration energy of, and corresponds with a high absorption coefficient of, the phenyl-OH functional group. The principle underlying the present invention is that the functional chemical group created in the acid catalyzed chemical transformation product must possess a unique characteristic IR absorption at the wavenumber of the irradiating IR source being used. Suitable characteristic IR absorption bands for most chemically amplified resists typically fall between about 1500 $cm^{-1}$ and 4000 $cm^{-1}$.

IR radiation of a particular wavenumber can be selectively supplied to the chemically amplified resist layer by using a conventional IR source with a filter to remove IR radiation at all other wavenumbers. The IR source should be designed to supply IR radiation uniformly across the chemically amplified resist layer.

During the IR-based PEB step, both the DUV-exposed and DUV-unexposed regions initially absorb the same amount of IR radiation due to the uniform concentrations (referred to as "m" in FIG. 2) of phenyl-OH functional groups in the chemically amplified resist layer. The absorbed IR radiation is transformed into heat energy, raising the local temperature of the chemically amplified resist layer. Thus, the temperature of both the DUV-exposed and the DUV-unexposed regions initially becomes higher.

Figure 2:
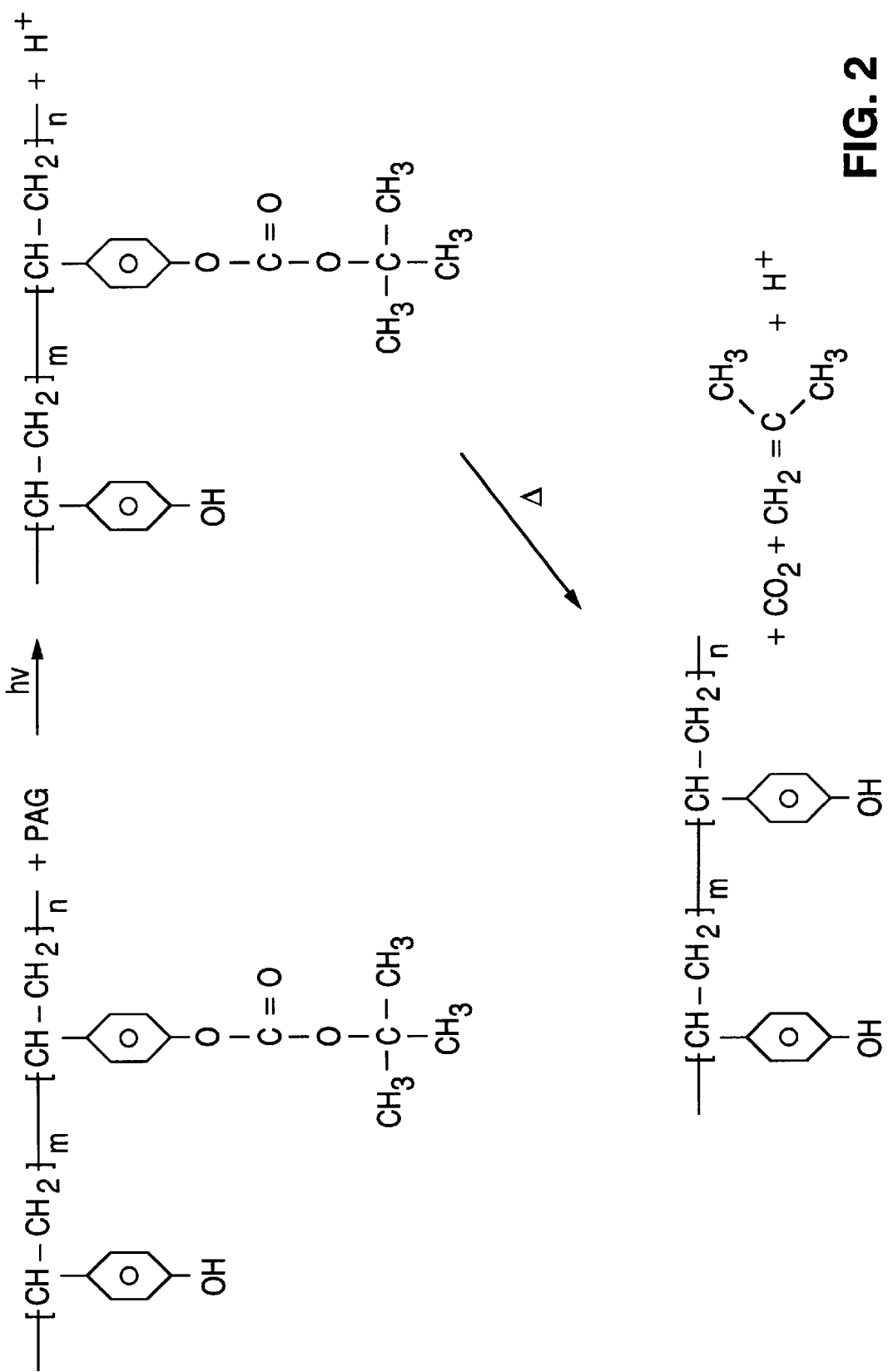
FIG. 2 depicts the chemical reactions associated with a conventional chemically amplified photoresist lithographic processes.

In the DUV-exposed regions, however, the resultant higher temperature initiates and accelerates acid catalyzed chemical transformations of the resist polymer. These transformations in turn produce additional phenyl-OH functional groups (as shown in FIG. 2). The presence of these additional phenyl-OH functional groups results in further preferential absorption of IR radiation in the DUV-exposed regions, increasing heat generation. The preferential, or selective, heat generation amplifies the local temperature yet even more, further accelerating the catalyzed chemical transformations in the DUV-exposed region.

In the DUV-unexposed regions, on the other hand, there is no photo-generated acid catalyst to initiate a chemical transformation. Therefore, no additional phenyl-OH functional groups are produced during the IR-based PEB step, meaning that IR absorption in the DUV-unexposed regions remains relatively constant and is significantly lower than that in the DUV-exposed regions.

Only a limited amount of thermal heat transfer from the DUV-exposed regions to the DUV-unexposed regions occurs during the transient time period of the PEB step. Therefore, DUV-exposed and DUV-unexposed regions will have different temperatures during this time. A temperature difference of at least 5° C. is necessary before achieving significant improvements in critical dimension control.

By employing IR radiation of the appropriate wavenumber, the temperature of the DUV-exposed regions can be amplified in comparison with that of the DUV-unexposed regions during the course of the IR-based PEB step. Because of the amplified temperature in the DUV-exposed regions, the photo-generated acid catalyst can quickly diffuse to t-BOC functional groups, resulting in accelerated acid catalyzed chemical transformations. In the DUV-unexposed regions, however, the temperature remains relatively low during the IR-based PEB step. Since catalyst diffusion depends on temperature, the geometric boundary between the DUV-exposed regions and the DUV-unexposed regions acts as a thermal barrier, impeding catalyst diffusion. When catalyst reaches this boundary, the rate of catalyst diffusion/migration into the DUV-unexposed regions significantly slows down due to the temperature differential. The reduced rate of catalyst diffusion/migration into the DUV-unexposed regions suppresses catalyst diffusion-induced critical dimension change in patterned resist layer.

Figure 3D:
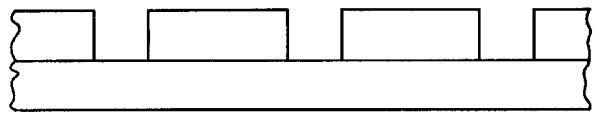

Subsequent to the step of irradiating the chemically amplified resist layer with IR radiation (i.e. the IR radiation-based PEB step), the chemically amplified resist layer is developed to form a patterned resist layer, as illustrated in FIG. 3D. The development can be done by any conventional techniques known to those skilled in the art, including the use 30–50 ml of aqueous base, such as 0.26 normal tetramethyl ammonium hydroxide (TMAH), as the developer solution at about 21.5° C. for a period of approximately 60 seconds.

Besides critical dimension control, processes in accordance with the present invention also provide for improved depth of focus. This is because the PEB time can be extended without a significant increase in the catalyst diffusion/migration into DUV-unexposed regions due to the temperature difference between the DUV-exposed and DUV-unexposed regions.

As described earlier, the ratio of the phenyl-OH functional group to the t-BOC functional group (i.e. the ratio of m to n in FIG. 2) in conventional chemically amplified resist is about 7:3. However, to achieve more precise critical dimension control, the initial concentration of the phenyl-OH functional group in chemically amplified resist is ideally lower than that of the t-BOC functional group, because the development rate in the DUV-unexposed regions will be slower than that in the DUV-exposed regions. In theory, a relatively high PEB temperature or a long PEB time could then be used to convert a sufficient concentration of t-BOC functional groups in the DUV-exposed regions to phenyl-OH functional groups and thereby provide the needed contrast in development rate in these two regions. In reality for conventional processing, where the temperature is uniform between the DUV-exposed and DUV-unexposed regions, the use of high PEB temperature or long PEB time will result in the diffusion of acid catalyst into DUV-unexposed regions and the loss of the critical dimension control. In processes according to the present invention, however, such diffusion of acid catalyst is suppressed due to the existence of the aforementioned "thermal barrier" between these two regions, enabling the use of the long PEB time needed to produce a desired contrast in the development rate.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A photolithographic method with an IR radiation post-exposure bake for use during semiconductor manufacturing, the method comprising the steps of:

providing a substrate;

coating a chemically amplified resist layer onto the substrate;

providing a mask;

exposing the chemically amplified resist layer to a first radiation through the mask to produce exposed regions of the chemically amplified resist and unexposed regions of chemically amplified resist, and to generate a catalyst in the exposed regions;

irradiating the exposed and unexposed regions with a particular wavelength of infra-red (IR) radiation for a predetermined time to selectively heat the exposed and unexposed regions such that the exposed regions attain a temperature at least 5° C. higher than the temperature of the unexposed regions; and developing the chemically amplified resist layer to define a patterned chemically amplified resist layer.

2. The method of claim 1, wherein the irradiating step includes irradiating the exposed and unexposed regions with IR radiation of a wavenumber that is preferentially absorbed by the exposed regions relative to the unexposed regions, such that the exposed regions attain a higher temperature than the unexposed regions.

3. The method of claim 2 wherein the irradiating step includes irradiating with IR radiation that is absorbed by a product of a reaction initiated by the catalyst in the exposed regions.

4. The method of claim 3 wherein the irradiating step includes irradiating with IR radiation having a wavenumber of from 1500 $cm^{-1}$ to 4000 $cm^{-1}$.

5. The method of claim 1, wherein the exposing step includes exposing the chemically amplified resist layer to DUV radiation.

6. The method of claim 5 wherein the exposing step includes exposing the chemically amplified resist layer to DUV with a wavelength of 193 nm.

7. The method of claim 4 wherein the exposing step includes exposing the chemically amplified resist layer to DUV with a wavelength of 248 nm.

8. The method of claim 1 wherein the coating step includes coating a chemically amplified resist layer that contains poly(4-hydroxystyrene) (PHOST) partially protected with t-butoxycarbonyl (t-BOC).

9. The method of claim 8 wherein the irradiating step includes irradiating the exposed and unexposed regions with IR radiation having a wavenumber of 3400 $cm^{-1}$.

10. A photolithographic method with an IR radiation post-exposure bake for use during semiconductor manufacturing, the method comprising the steps of:
 providing a substrate;
 coating a chemically amplified resist layer onto the substrate, wherein the chemically amplified resist includes poly(4-hydroxystyrene) (PHOST) partially protected by t-butoxycarbonyl (t-BOC);
 providing a mask;
 exposing regions of the chemically amplified layer to DUV radiation with a wavelength of 248 nm through the mask to produce DUV-exposed regions of chemically amplified resist and DUV-unexposed regions of chemically amplified resist, and to generate a catalyst in the DUV exposed regions;
 irradiating the DUV-exposed and DUV-unexposed regions with infrared (IR) radiation having a wavenumber of 3400 $cm^{-1}$ for a predetermined time to selectively heat the DUV-exposed and DUV-unexposed regions; and
 developing the chemically amplified resist layer to define a patterned chemically amplified resist layer.

11. The method of claim 10 wherein the irradiating step includes irradiating with IR radiation that is preferentially absorbed by the DUV-exposed regions relative to the DUV-unexposed regions, such that the DUV-exposed regions attain a temperature at least 5° C. higher than the temperature of the DUV-unexposed regions.

* * * * *